(12) United States Patent
Ma et al.

(10) Patent No.: US 7,894,285 B2
(45) Date of Patent: Feb. 22, 2011

(54) CIRCUITS, SYSTEMS, AND METHODS FOR REDUCING SIMULTANEOUS SWITCHING OUTPUT NOISE, POWER NOISE, OR COMBINATIONS THEREOF

(75) Inventors: Yantao Ma, Boise, ID (US); Todd Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 177 days.

(21) Appl. No.: 12/270,533

(22) Filed: Nov. 13, 2008

(65) Prior Publication Data
US 2010/0118632 A1    May 13, 2010

(51) Int. Cl.
*G11C 7/02* (2006.01)

(52) U.S. Cl. .......... 365/206; 365/226; 365/227; 365/228; 365/229

(58) Field of Classification Search ........... 365/206, 365/226, 227, 228, 229
See application file for complete search history.

(56) References Cited

U.S. PATENT DOCUMENTS

| | | | |
|---|---|---|---|
| 5,144,161 A | 9/1992 | Inaba | 307/443 |
| 5,220,209 A | 6/1993 | Seymour | 307/443 |
| 5,517,130 A | 5/1996 | Sandhu | 326/27 |
| 5,734,277 A | 3/1998 | Hu et al. | 327/108 |
| 5,781,473 A * | 7/1998 | Javanifard et al. | 365/185.18 |
| 5,786,709 A | 7/1998 | Kirsch et al. | 326/27 |
| 6,498,761 B2 * | 12/2002 | Banba et al. | 365/226 |
| 7,724,603 B2 * | 5/2010 | Choy et al. | 365/226 |
| 2010/0042858 A1 * | 2/2010 | Padhye et al. | 713/323 |

FOREIGN PATENT DOCUMENTS

KR    2004/0087420 A    10/2004

* cited by examiner

*Primary Examiner*—Pho M Luu
(74) *Attorney, Agent, or Firm*—Dorsey & Whitney LLP (57) ABSTRACT

Memory devices and methods are provided for reducing simultaneous switching output noise and power supply noise during burst data write and refresh operations. An embodiment of a memory device according to the present invention includes a first power domain coupled to some of the components of the memory device and a second power domain coupled to different components of the memory device. One or more distributed power domain coupling circuits may be coupled to the first and second power domains. The power domain coupling circuit includes a controller configured to generate an enable signal responsive to control signals, data signals, or any combination thereof. The power domain coupling circuit also includes coupling circuitry coupled to the first and second power domains and coupled to the controller. The coupling circuitry is configured to couple the first and second power domains together responsive to the enable signal.

27 Claims, 5 Drawing Sheets

CIRCUITS, SYSTEMS, AND METHODS FOR REDUCING SIMULTANEOUS SWITCHING OUTPUT NOISE, POWER NOISE, OR COMBINATIONS THEREOF

TECHNICAL FIELD

Embodiments of the invention relate generally to semiconductor memory, and in one or more embodiments, to methods and circuits for reducing simultaneous switching output (SSO) noise and reducing power supply noise during data (burst) write and refresh operations.

BACKGROUND OF THE INVENTION

Integrated circuit devices may rely on one or more power supplies to provide operating power. Power supply voltages $V_{CC}$ and ground may be supplied to multiple locations within an integrated circuit to provide the operating power. The connections to these power supply voltages, as well as the circuitry used to produce the power supply voltages, may provide capacitance and resistance associated with the power supply voltages. Accordingly, the power supply voltages are not ideal. When multiple circuits coupled to the power supply voltages switch simultaneously, the load on the power supply voltage supply itself may cause the power supply voltage to shift, a phenomenon known as simultaneous switching output noise.

Prior systems address the problem of simultaneous switching output noise through data bus inversion, where the data is inverted at times in an attempt to balance the number of 1s and 0s communicated or through minimizing the number of transitioning signals during the communication. However, data bus inversion requires an additional output to indicate when the data is inverted, and when it is not. Moreover, it may require extra high speed data process logic with high power consumption; which may limit practical usage at high speed applications due to the shrinking timing budget for bus inversion processing data.

Still other prior systems address the problem of simultaneous switching output noise by coupling a capacitor and resistor to an output node of a circuit. When the output voltage overshoots a target output voltage, the capacitor stores the overshoot energy. When the output voltage undershoots the target output voltage, the capacitor may release energy. However, this approach is limited in that it addresses over- and under-shoots in a circuit output voltage and requires that the output node be coupled to a capacitor and resistor. The approach does not address reducing noise in the power supply voltages themselves, only the downstream effect at the circuit's output node. It may not be suitable for wide spread data output distribution, where uniformity among all DQs are specified with phase noise is different at various locations.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, components, control signals, timing protocols, and software operations have not been shown in detail in order to avoid unnecessarily obscuring the described embodiments of the invention.

Integrated circuits may utilize several different power supply voltages. For example, a memory device may utilize one set of power supply voltages, $V_{CC}$ and ground, for example, to perform write operations to write data from memory cells in the device. When performing a read operation, however, different power supply voltages, $V_{DDQ}$ and $V_{SSQ}$ may be used. $V_{DDQ}$ and $V_{SSQ}$ may provide a larger voltage difference than $V_{CC}$ and ground so that the data outputting operation may be more reliably performed to meet certain specifications. In this manner, two different power domains are routed throughout portions of the integrated circuit. In some embodiments, the two power domains represent two different routing paths, and the voltages or voltage difference in the two power domains, or both, may be the same. A first power domain is $V_{CC}$ and ground and some portions of the integrated circuit are coupled to this first power domain all the time or at specified times according to the requested operation. A second power domain is $V_{DDQ}$ and $V_{SSQ}$ and some portions of the integrated circuit are coupled to this second power domain all the time or at specified times according to the requested operation. Providing two power domains may result in excess power supply capacity when one of the power domains is not being used. That is, each power domain may be able to adequately handle a certain number of simultaneous switching outputs before noise becomes an issue on one or more power supplies. If another, relatively unused, power domain can be coupled to a power domain experiencing more switching, the combined power network may be able to support a greater number of switching outputs without as much noise on the power supplies.

Embodiments of the invention utilize this excess capacity by coupling the two power domains together during all or a portion of the time that one domain is inactive or less active. By coupling the power domains together, the capacity, stability, and capability of noise handling of the two coupled power domains may significantly boost overall performance and improve operational margins. The effect of simultaneous switching output noise may be reduced because the combined power domain is less effected by the switching demands of the integrated circuit. Further, if the power domains that are coupled together have complementary noise patterns, that is if the power domains experience loading at different times, then one power domain can assist the other during a period of low demand, and vice versa.

Figure 1:
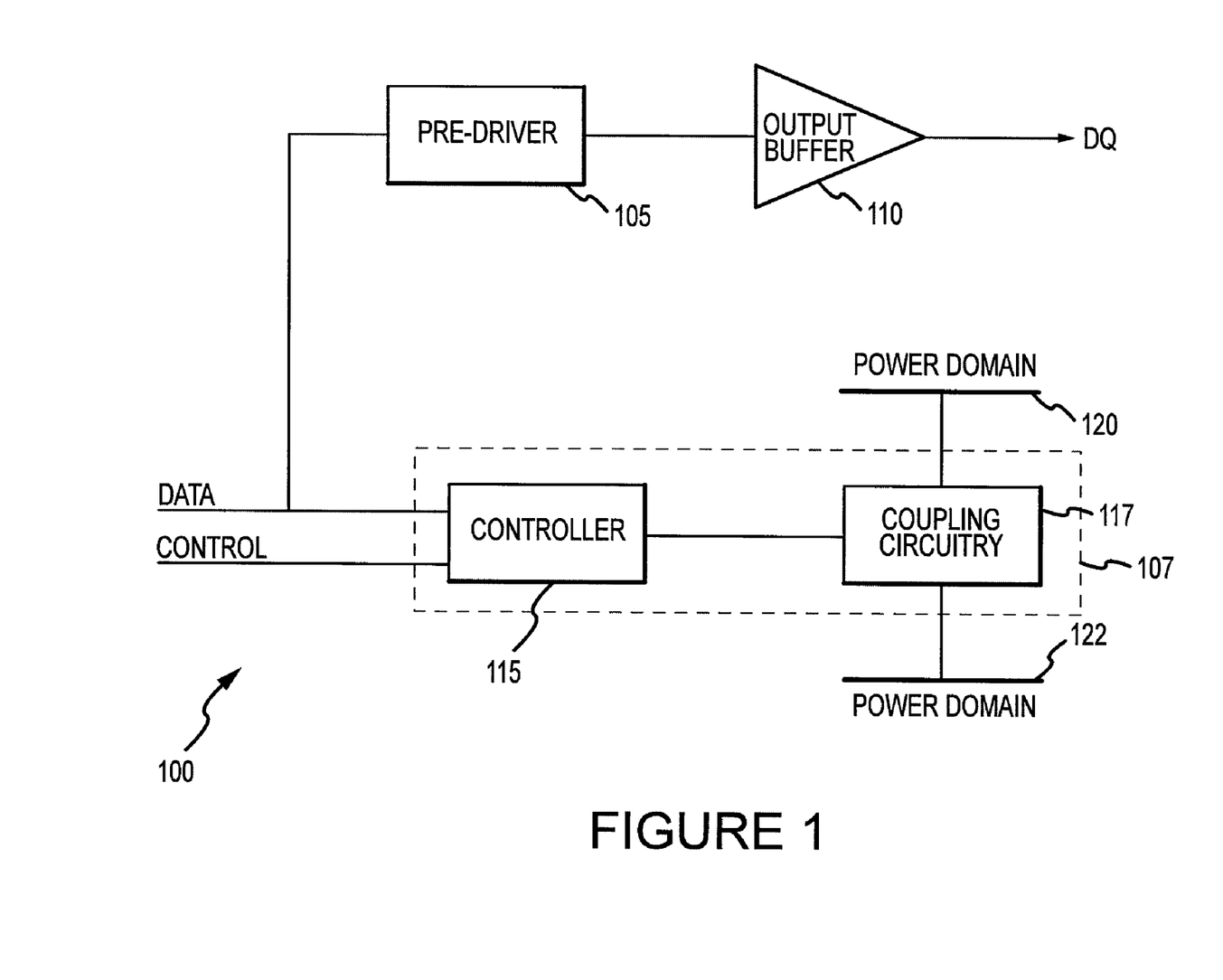
FIG. 1 is a schematic diagram of a portion of a memory device according to an embodiment of the present invention.

FIG. 1 is a schematic illustration of a portion of a memory device 100 implementing an embodiment of the present invention. Data signals are coupled, as known in the art, through one or multiple stages of pre-drivers 105 and an output buffer 110, and then to a data pad (DQ). Two power domains 120 and 122 are included on the memory device 100. The power domain 122 represents a power domain using voltages $V_{CC}$ and ground, in one embodiment, and may be referred to as the C-bus. The power domain 120 represents a power domain using voltages $V_{DDQ}$ and $V_{SSQ}$ in one embodiment, and may be referred to as the Q-bus. The voltage $V_{SSQ}$ may be equal to ground in some embodiments, and the voltage $V_{DDQ}$ may be equal to the voltage $V_{CC}$ in some embodiments. Generally, one or all stages of the pre-driver 105 may be powered by the power domain 122, although some stages of the pre-driver 105 closer to the output buffer 110 may be powered by the power domain 120 in some embodiments. The output buffer 110 may be powered by the power domain 120 in some embodiments.

The memory device 100 includes power domain coupling circuitry 107. The two power domains 120 and 122 may be coupled to one another through the power domain coupling circuitry 107. The coupling circuitry 107 may be provided along a length of the power domain busses, which may extend throughout an integrated circuit. By providing multiple coupling locations at various positions along the power domain busses, coupling between the busses may be more uniform. The power domain coupling circuit 107 includes a controller 115. As will be described further below, the controller 115 provides data look ahead control logic with a control signal to coupling circuitry 117 to couple or decouple the power domains 120 and 122 based on the forthcoming output data patterns. The controller 115 is generally powered by the power domain 122 in some embodiments. The power domain coupling circuit 107, when enabled, may store excess energy generated during switching that would otherwise cause the power supply voltage to rise and supply stored energy during switching when the power supply voltage may otherwise fall. In this manner, the coupling circuitry 117 may reduce the noise on the power supplies to which they are coupled.

Energy storage and release by the coupling circuitry 117 may be implemented in any manner known in the art, generally including a capacitor or other element having a capacitance. In some embodiments, however, no capacitance is provided and no additional energy storage is provided. Even without additional energy storage, coupling the two power domains 120 and 122 together through the power domain coupling circuit 107 may reduce noise on the power supplies. The coupling circuitry 117 may also include a resistor which may damp swing noise generated during switching. Because the coupling circuitry 117 has a capacitance to store energy, they may adversely affect the performance of the power supplies to which they are coupled by too much noise coupling depending on the actual implementations. Therefore, in some embodiments the power domains may be selectively coupled only during certain times. Accordingly, in some embodiments, the coupling circuitry 117 is not always coupled to the power domains. Rather, power domain coupling can be selectively enabled responsive to command and data signals received by the memory device, as will be described further below.

FIGS. 2-5 depict different implementations of the coupling circuitry 117 used to couple two power domains in FIG. 1. Other implementations of the coupling circuitry 117 may also be used. FIGS. 2-5 depict the coupling of two power domains 120 and 122. The power domain 120 includes two power supply voltages $V_{DDQ}$ and $V_{SSQ}$. This power domain 120 may also be referred to as the Q bus. The power domain 122 includes two power supply voltages $V_{CC}$ and Ground. The power domain 122 may also be referred to as the C bus. The voltage $V_{DDQ}$ is generally equal to or higher than the $V_{CC}$ voltage and the voltage $V_{SSQ}$ equal to or lower than ground. In this manner, the power domain 120 represents a greater voltage difference than the power domain 122. The power domain 120 may be used to perform read operations from a memory array where a larger voltage difference may be advantageous for high speed, faster slew rate, or better signal-to-noise ratio. The power domain 122 may be used to perform write and refresh operations. The respective roles of the power domains 120 and 122 are indicated in FIGS. 2-5 by their coupling to respective read data buffers 210 and write data buffers 220. Capacitors 212 and 214 are provided for each respective power domain for noise coupling and to store and release energy between power supplies.

Figure 2:
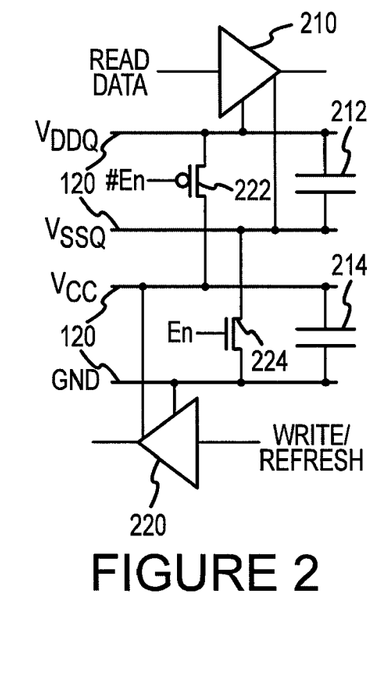
FIG. 2 is a schematic diagram of coupling circuitry according to an embodiment of the present invention.

In FIG. 2, the power domains 120 and 122 are coupled together by two transistors 222 and 224. When turned on, the transistor 222 couples $V_{DDQ}$ to $V_{CC}$. When turned on, the transistor 224 couples $V_{SSQ}$ to Ground. The gate of the transistor 224 receives an enable signal, En, while the gate of the transistor 222 receives the complement of the enable signal, #En. The transistor 222 may be a PMOS transistor, while the transistor 224 is an NMOS transistor such that both transistors 222 and 224 are turned on responsive to a high level enable signal. In the embodiment shown in FIG. 2, the transistors 222 and 224 provide direct coupling between the power domains, without additional energy storage capability between the two domains. Accordingly, when turned on, the transistors couple the power domains 120 and 122 such that simultaneous switching output noise may be reduced by increasing the capacity of the power domains by coupling the power domain capacitors and driving capability in parallel. The configuration shown in FIG. 2 may be used with power domains having the same voltages, where for example $V_{DDQ}$ and $V_{CC}$ are equal and $V_{SSQ}$ is equal to ground. Of course, the configuration may be used with other voltage levels as well in some embodiments.

Figure 3:
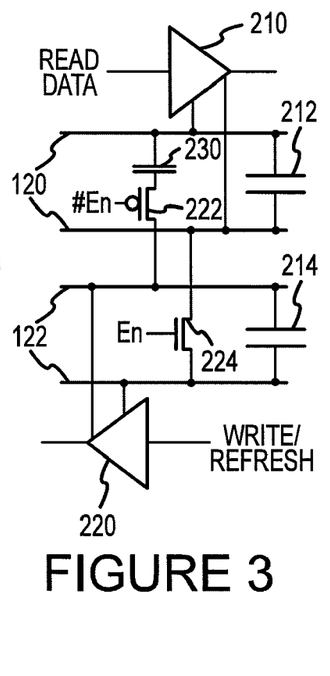
FIG. 3 is a schematic diagram of coupling circuitry according to an embodiment of the present invention.

In FIG. 3, a capacitor 230 is coupled between the transistor 222 and $V_{DDQ}$. The capacitor 230 may store excess energy, and supply stored energy, during switching. The capacitor 230 may advantageously be smaller than the capacitors 212 and 214 to provide high-pass filtering for dominating SSO noise during switching. In addition to the capacitor 230, a resistor, although not shown, may also be provided between the transistor 222 and $V_{DDQ}$ to damp voltage swings associated with the power supply voltage. The embodiments shown in FIG. 3 may be used when $V_{DDQ}$ is at different DC level than $V_{CC}$. The capacitor 230 removes or reduces a DC path between the two levels.

Figure 4:
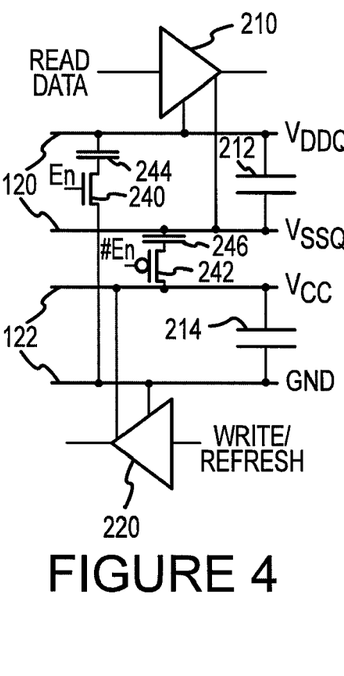
FIG. 4 is a schematic diagram of coupling circuitry according to an embodiment of the present invention.

FIG. 4 depicts coupling circuit including a transistor 240 that, when turned on, couples $V_{DDQ}$ to Ground, and a transistor 242 that, when turned on, couples $V_{SSQ}$ to $V_{CC}$. Energy storage capacitors 244 and 246, which can be large, are provided for storing excess energy and providing stored energy during switching, as described above. This configuration provides a greater voltage difference across the energy storage capacitors 244 and 246. The larger voltage difference may increase the coupling achieved through the capacitor to achieve higher efficiency.

Figure 5:
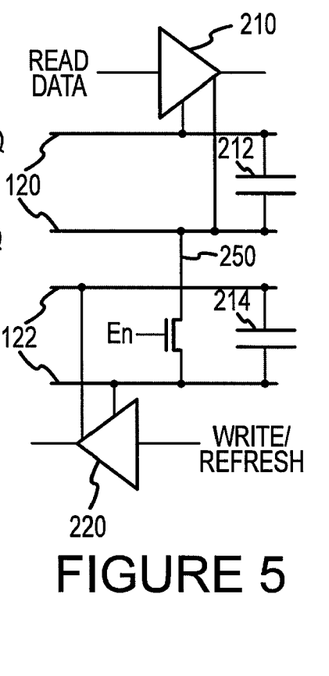
FIG. 5 is a schematic diagram of coupling circuitry according to an embodiment of the present invention.

Another embodiment of coupling circuitry 117 is shown in FIG. 5. A transistor 250 is provided that, when turned on, couples $V_{SSQ}$ to ground. This configuration may be used in situations where power domain coupling is only desired on one power supply voltage, such as $V_{SSQ}$ or ground to have common ground and reduce ground bounce.

Figure 6:
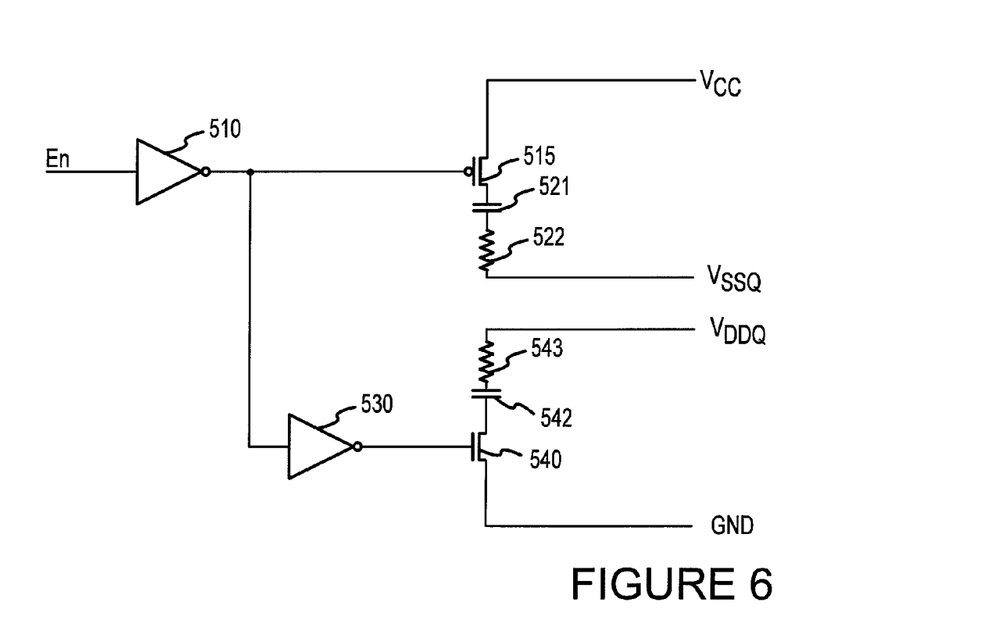
FIG. 6 is a timing diagram of signals used in embodiments of the present invention.

Yet another embodiment of coupling circuitry 117 is shown in FIG. 6. The embodiment in FIG. 6 is similar to that shown in FIG. 4. An enable signal is coupled to an inverter 510 which in turn is coupled to the gate of a transistor 515.

When turned on, the transistor 515 couples $V_{CC}$ to $V_{SSQ}$ through capacitor 521 and resistor 522. The output of the inverter 510 is further coupled to inverter 530, which is coupled to the gate of a transistor 540. When turned on, the transistor 540 couples $V_{DDQ}$ to $V_{SSQ}$ through capacitor 542 and resistor 543.

Embodiments of methods and circuits for coupling two power domains together, and storing excess energy and releasing stored energy during switching have been described above. However, as has been briefly described, the coupling of the power domains may not be continuous. Rather, the coupling of the power supplies may be enabled and disabled responsive to the load on the power supplies in embodiments of the present invention. Examples of methods and systems for enabling and disabling the power domain coupling, and the storage and release of switching energy will now be described further below.

Figure 7:
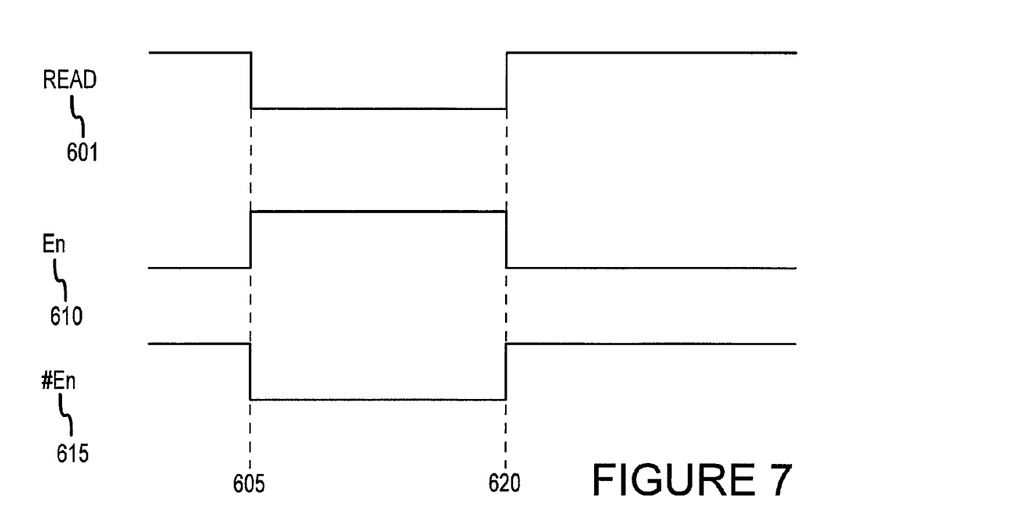
FIG. 7 is a schematic diagram of coupling circuitry according to an embodiment of the present invention.

As described with reference to FIGS. 2-5, memory devices may utilize the $V_{DDQ}$ and $V_{SSQ}$ voltages during outputting data of read operations while using the $V_{CC}$ and GND voltages during all the rest operations except outputting data, including for example input buffering, command decoding, read logic, write logic and refresh operations. Accordingly, during memory reads, it may not be desirable to further load the $V_{DDQ}$ and $V_{SSQ}$ buses. However, when data outputs are not enabled, like auto/self-refresh, burst write operations, the $V_{DDQ}$ and $V_{SSQ}$ buses are not being used. Accordingly, in some embodiments, referring back to FIG. 1, the controller 115 enables the power domain coupling during periods when a read is not being performed, such as during write and refresh operations. Accordingly, a command decoder of the memory device (not shown in FIG. 1) may decode a read command. The read command, or an indication that a read command was received, may be coupled to the controller 115. The controller 115 may then disable the coupling circuitry 117 responsive to the read command, and enable the coupling circuitry 117 after the read command has been processed based on read latency. A timing diagram illustrating this concept is shown in FIG. 7. A read signal 601 having a logic level indicative of a read command is provided to the controller 115. The read signal 601 is high, indicating a read operation, until a time 605. At time 605, the read signal 601 transitions low, indicating the read operation is complete. At the time the read signal transitions low, the controller 115 generates an enable signal En 160 that transitions high and a complementary enable signal #En 615 that transitions low. The enable signal En 160 and the complementary enable signal #En remain high and low, respectively, during the time the read signal 601 is low, that is, during the time a read operation is not performed. The En and #En signals can be used with coupling circuitry, such as the embodiments of coupling circuitry shown in FIGS. 2-5, to enable coupling circuitry during the time a read operation is not being performed. When the read signal 601 transitions from low to high at time 620, indicating another read operation, the controller 115 generates an enable signal 160 that transitions low and generates a complementary enable signal #En 615 that transitions high. The En and #En signals can be used to disable the coupling circuitry. As a result, the En and #En signals may be applied to the coupling circuitry to enable the coupling circuitry during periods of time when a read operation is not being performed.

In other embodiments, it may be desirable to utilize power domain coupling during a read operation. However, due to capacitive loading and the possibility of damaging one or more voltage supplies by overloading the supply, referring back to FIG. 1, the controller 115 may selectively enable the coupling circuitry 117 during periods of time when the coupling may be beneficial. For example, in some embodiments, the coupling circuitry 117 may be enabled when more data pins are switching in one direction than another by a predefined threshold difference. When a more equal number of pins are switching in both directions, SSO noise may be less of a problem. Accordingly, the controller 115 may provide an active enable signal when the number of DQs switching in one direction is greater than a threshold number of DQs. For example, in one embodiment an active enable signal is provided in a device having eight DQs when 6 or more DQs are switching in one direction (such as high to low, or low to high). In an embodiment having sixteen DQs, an active enable signal may be generated when 11 or more DQs are switching in one direction. In an embodiment having thirty-two DQs, an active enable signal may be provided when 22 or more DQs are switching in one direction. Other thresholds and devices having different numbers of DQs are also possible. The enable signal generated by the controller 115 may be provided to switching circuitry, such as the switching circuitry of FIG. 6.

Figure 8:
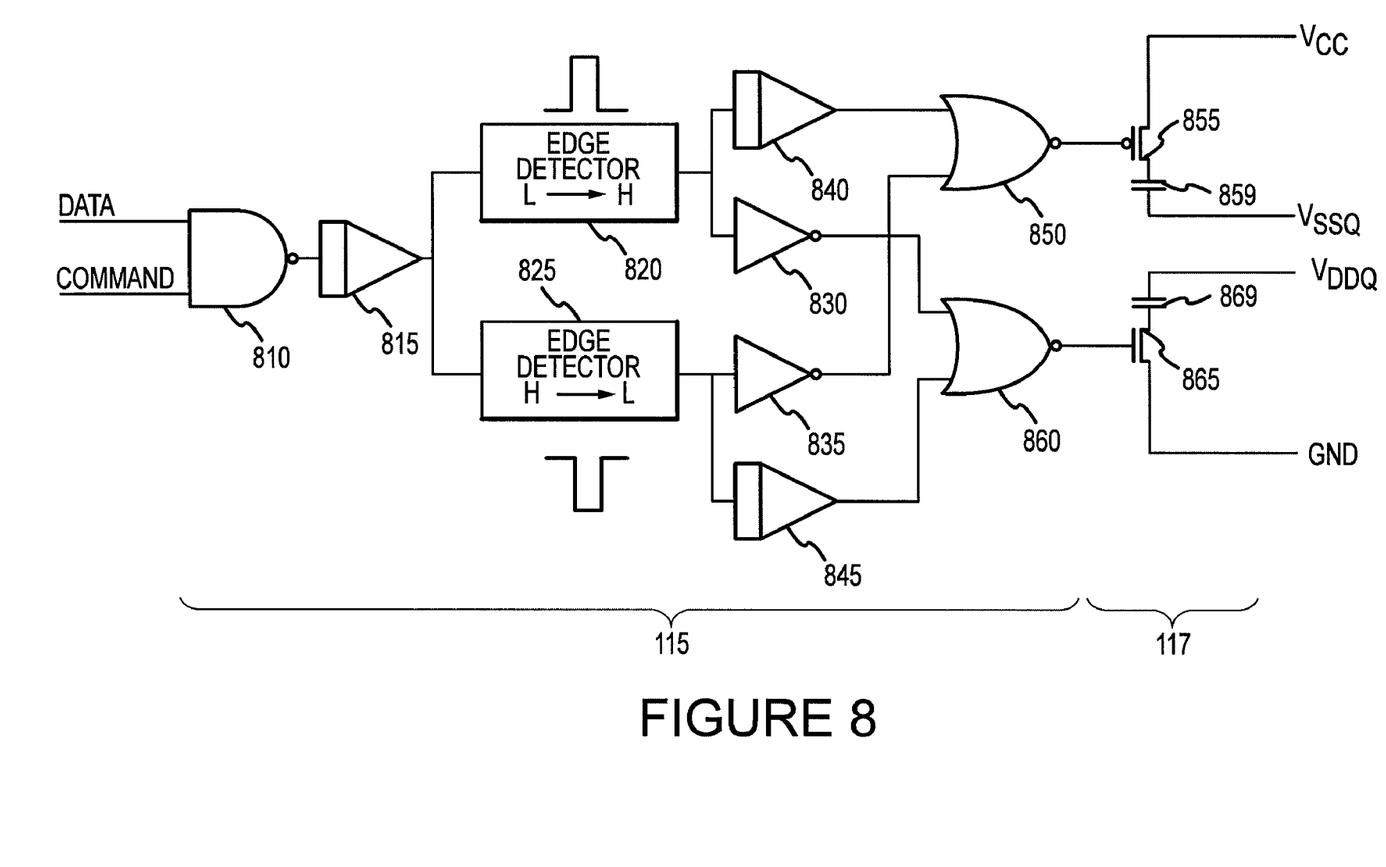
FIG. 8 is a schematic diagram of a power domain coupling circuit according to an embodiment of the present invention.

In another embodiment, referring back to FIG. 1, the controller 115 may be configured to enable the coupling circuitry 117 during a read operation to couple only a portion of the power domains 120 and 122 together. For example, during a DQ transition from low to high, noise on the higher power supply voltage of the power domain used for reading, the Q bus, may occur. Accordingly, the controller 115 may enable the coupling circuitry 117 for coupling only $V_{DDQ}$ to the second power domain (either to $V_{CC}$ or to Ground). Similarly, if a DQ is switching from high to low, ground bounce may occur, so the controller 115 may enable the coupling circuitry 117 to couple $V_{SSQ}$ only to ground or $V_{CC}$, while $V_{DDQ}$ is not coupled to the other power domain. One embodiment for implementing a controller 115 in this manner is shown in FIG. 8. Data and command signals may be coupled to a NAND gate 810. For example, the controller 115 of FIG. 8 may be configured to enable the coupling circuitry during reads, so a read signal may be coupled to the NAND gate 810. The NAND gate 810 is coupled to a delay element 815. The delay element 815 may be provided to match propagation of signals to the coupling circuitry 117 (FIG. 1) to the propagation of signals through the pre-driver and output buffers.

The output of the delay element 815 is coupled to two edge detectors 820 and 825. The edge detector 820 generates a high pulse signal responsive to the receipt of a low to high data signal transition. The edge detector 825 generates a low pulse signal responsive to the receipt of a high to low data signal transition. The pulse streams generated by the edge detectors 820 and 825 are coupled to respective inverters 830 and 835 and delay elements 840 and 845. The output of the inverter 835 and the delay element 840 are coupled to NOR gate 850. In this manner, the NAND gate turns on the transistor 855 to couple $V_{CC}$ to $V_{SSQ}$ through the capacitor 859, responsive to receipt of a pulse indicating a high→low transition from the edge detector 825. However, the transistor 855 is not turned on if a low→high transition was detected soon before the high→low transition. That is, the inverters 830 and 835 and the delay elements 840 and 845 coupled to the NOR gate 850 and the NAND gate 860 serve as a glitch filter that may eliminate spurious transitions that are not representative of a true transition of the signal. The output of the inverter 830 is coupled to the NAND gate 860, as is the output of the delay element 845. The NAND gate 860 turns on the transistor 865 to couple $V_{DDQ}$ to GND through the capacitor 869 responsive to detection of a low→high transition by the edge detector 820. However, the transistor 865 is not enabled if the transition is determined to be spurious by the glitch filter. The coupling circuitry 117 in FIG. 8 includes the transistors 855, 865 and capacitors 869 and 859. Any other coupling circuitry embodiments described above may also be used.

Figure 9:
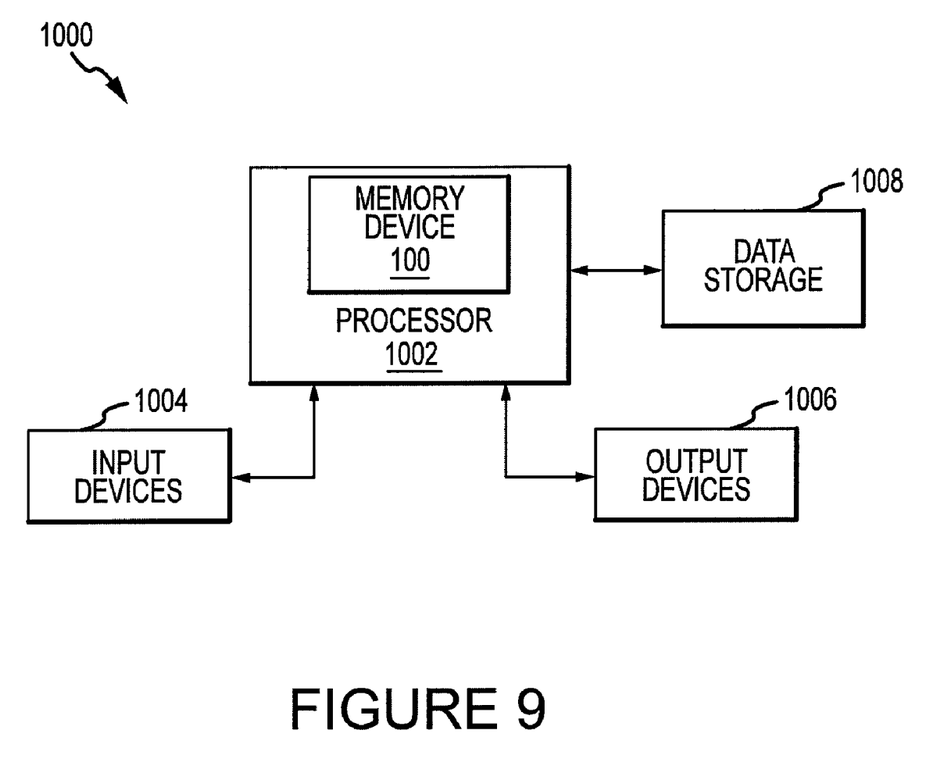
FIG. 9 is a schematic diagram of a system according to an embodiment of the present invention.

FIG. 9 is a block diagram of a processor-based system 1000 including processor circuitry 1002, which includes the memory device 100, a portion of which is shown in FIG. 9. Typically, the processor circuitry 1002 is coupled through address, data, and control buses to the memory device 100 to provide for writing data to and reading data from the memory device. The processor circuitry 1002 includes circuitry for performing various processing functions, such as executing specific software to perform specific calculations or tasks. In addition, the processor-based system 1000 includes one or more input devices 1004, such as a keyboard or a mouse, coupled to the processor circuitry 1002 to allow an operator to interface with the processor-based system 1000. Typically, the processor-based system 1000 also includes one or more output devices 1006 coupled to the processor circuitry 1002, such as output devices typically including a printer and a video terminal. One or more data storage devices 1008 are also typically coupled to the processor circuitry 1002 to store data or retrieve data from external storage media (not shown). Examples of typical storage devices 1008 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention.

What is claimed is:

1. A memory device comprising:
a first power domain configured to supply a first power supply voltage;
a second power domain configured to supply a second power supply voltage; and
a coupling circuit coupled to the first and second power domains, the coupling circuit comprising:
a controller configured to receive control and data signals, the controller configured to generate an enable signal responsive to the control signals, data signals, or any combination thereof; and
coupling circuitry coupled to the first and second power domains and coupled to the controller, the coupling circuitry configured to couple the first and second power domains together responsive to the enable signal.

2. The memory device according to claim 1 wherein a read data buffer is coupled to the first power domain and a write data buffer is coupled to the second power domain.

3. The memory device according to claim 1 wherein the coupling circuitry is configured to couple the power domains together at a plurality of locations.

4. The memory device according to claim 3 wherein a plurality of read data buffers are coupled to the first power domain and a plurality of write data buffers are coupled to the second power domain, and wherein the plurality of locations corresponds to the locations of the read and write data buffers.

5. The memory device according to claim 1 wherein the first power domain includes a first high voltage supply line and a first low voltage supply line and the second power domain includes a second high voltage supply line and a second low voltage supply line.

6. The memory device according to claim 5 wherein the coupling circuitry comprises a first transistor coupled between the first high voltage supply line and the second high voltage supply line, the first transistor configured to receive the enable signal; and a second transistor coupled between the first low voltage supply line and the second low voltage supply line, the second transistor configured to receive the enable signal.

7. The memory device according to claim 6 wherein the coupling circuitry further comprises a capacitor between the first transistor and the first high voltage supply line, the capacitor configured to store excess energy and release stored energy during switching.

8. The memory device according to claim 5 wherein the coupling circuitry comprises:
a first transistor coupled between the first high voltage supply line and the second low voltage supply line, the first transistor configured to receive the enable signal, and responsive to the enable signal to couple the first high voltage supply line to the second low voltage supply line;
a capacitor coupled between the first transistor and the first high voltage supply line;
a second transistor coupled between the first low voltage supply line and the second high voltage supply line, the second transistor configured to receive the enable signal and couple the first low voltage supply line to the second high voltage supply line; and
a second capacitor coupled between the second transistor and the second high voltage supply line.

9. The memory device according to claim 8 further comprising a first resistor coupled between the first capacitor and the second low voltage supply line and a second resistor coupled between the second capacitor and the second high voltage supply line.

10. The memory device according to claim 5 wherein the coupling circuitry comprises a transistor coupled between the first low voltage supply line and the second low voltage supply line, the transistor configured to receive the enable signal and couple the first low voltage supply line to the second low voltage supply line.

11. The memory device according to claim 5 wherein the controller is configured to receive a read command, the controller configured to generate the enable signal during a period of time while the read command is being executed, the controller further configured to receive read data, the controller configured to detect a low to high transition in the read data and couple the first high voltage power line to the second power domain responsive to the low to high transition.

12. The memory device according to claim 1 wherein the controller is configured to receive a read command, the controller configured to generate the enable signal when the read command is complete.

13. The memory device according to claim 1 wherein the controller is configured to receive a read command, the controller configured to generate the enable signal during a period of time while the read command is being executed, the controller further configured to receive the read data corresponding to a plurality of data pins, the controller configured to generate the enable signal responsive to a number of read data signals transitioning from low to high exceeding a number of read data signals transitioning from high to low by a threshold amount.

14. The memory device according to claim 1 wherein the controller is configured to receive a read command, the controller configured to generate the enable signal during a period of time while the read command is being executed, the controller further configured to receive the read data corresponding to a plurality of data pins, the controller configured to generate the enable signal responsive to a number of read data signals transitioning from high to low exceeding a number of read data signals transitioning from low to high by a threshold amount.

15. A method for reducing simultaneous switching output noise in a memory device having a first and a second power domain, the method comprising:
    providing a first power supply voltage over the first power domain;
    providing a second power supply voltage over the second power domain;
    receiving data and control signals;
    generating an enable signal based on the data signal, control signal, or a combination thereof; and
    coupling the first power domain to the second power domain responsive to the enable signal.

16. The method according to claim 15 wherein a read command is executed using the first power domain and a write command is executed using the second power domain.

17. The method according to claim 15 wherein the first power domain includes a first high voltage supply line and a first low voltage supply line and the second power domain includes a second high voltage supply line and a second low voltage supply line.

18. The method according to claim 17 wherein the act of coupling the first power domain to the second power domain comprises coupling the first high voltage supply line to the second high voltage supply line and the first low voltage supply line to the second low voltage supply line, responsive to the enable signal.

19. The method according to claim 18 further comprising storing and releasing energy during switching of memory device outputs.

20. The method according to claim 17 wherein the act of coupling the first power domain to the second power domain comprises coupling the first high voltage supply line and the second low voltage supply line, and coupling the first low voltage supply line to the second high voltage supply line, responsive to the enable signal.

21. The method according to claim 17 wherein the act of coupling the first power domain to the second power domain comprises coupling the first low voltage supply line to the second low voltage supply line, responsive to the enable signal.

22. The method according to claim 15 wherein the act of generating the enable signal occurs responsive to an end of a read command.

23. The method according to claim 15 wherein the act of receiving data and control signals comprises receiving a read command and read data, the act of generating the enable signal occurring responsive to receipt of the read command and a number of read data signals transitioning from a first logic level to a second logic level exceeding a number of read data signals transitioning from the second logic level to the first logic level by a threshold amount.

24. The method according to claim 23 wherein the threshold amount is a number greater than one-half the read data concurrently output from the memory device.

25. The method according to claim 23 wherein the first logic level is a low logic level and the second logic level is a high logic level.

26. The method according to claim 23 wherein the first logic level is a high logic level and the second logic level is a low logic level.

27. The method according to claim 15 further comprising detecting a low to high transition in the read data, the act of generating the enable signal occurring responsive to detecting the low to high transition.

* * * * *